United States Patent [19]

Lach

[11] Patent Number: 4,712,061

[45] Date of Patent: Dec. 8, 1987

[54] SMALL PROPAGATION DELAY MEASUREMENT FOR DIGITAL LOGIC

[75] Inventor: Lawrence E. Lach, Chicago, Ill.

[73] Assignee: Gould Inc., Rolling Meadows, Ill.

[21] Appl. No.: 831,898

[22] Filed: Feb. 24, 1986

[51] Int. Cl.[4] .......................................... G01R 25/00

[52] U.S. Cl. ................................ 324/83 D; 307/352; 375/22; 379/90; 324/57 DE

[58] Field of Search ................... 307/352; 375/22, 66, 375/67; 379/410, 90; 324/78 D, 83 D, 79 D, 77 R

[56] References Cited

U.S. PATENT DOCUMENTS

| | | | |
|---|---|---|---|
| 4,064,378 | 12/1977 | Kitayama | 379/90 |
| 4,179,660 | 12/1979 | Zeis | 375/22 |
| 4,392,105 | 7/1983 | McLeod | 324/57 DE |
| 4,489,272 | 12/1984 | McLeod | 324/73 R |
| 4,584,559 | 4/1986 | Penney | 307/352 |

*Primary Examiner*—Michael J. Tokar

*Attorney, Agent, or Firm*—Robert J. Fox; Edward E. Sachs; G. Paul Edgell

[57] ABSTRACT

A circuit for measuring small propagation delays associated with a digital logic circuit has first and second signal paths. The first signal path in the digital logic circuit has at least a first predetermined number of devices and has an input and an output. Similarly, the second signal path in the digital logic circuit has at least a second predetermined number of devices and also has an input and an output. The first predetermined number of devices is different than the second predetermined number of devices. An input multiplexer multiplexes a predetermined input signal to the inputs of the first and second signal paths. First and second output signals are thereby produced on the outputs of the first and second signal paths, respectively. An output multiplexer causes the output signals to be combined into a single multiplexed output signal. An average propagation delay is determined from the differential area between the output signals in the multiplexed output signal.

28 Claims, 5 Drawing Figures

SMALL PROPAGATION DELAY MEASUREMENT FOR DIGITAL LOGIC

BACKGROUND OF THE INVENTION

The present invention relates in general to circuits and methods for analyzing the performance of digital logic circuits and, in particular, for measuring small propagation delays associated with digital logic circuits on large scale integration chips.

Two circuits and methods for measuring logic propagation delays of digital logic circuits are known in the prior art. These are methods which utilize a ring oscillator and a delayed Johnson counter.

In the ring oscillator method, an odd number of inverting logic gates are connected in sequence so as to form a closed loop. Since the number of devices is odd, the loop is unstable and oscillates. The observed frequency of oscillation is inversely proportional to the product of the average propagation delay of the logic gate times the number of logic gates used. One disadvantage to ring oscillator methods is that for testing very fast logic gates, a large number of gates are needed to reduce the oscillation frequency to a conveniently measurable frequency. In addition, high frequency test fixuring may still be required to measure the high oscillator frequency. Furthermore, in a performing delay versus fan out testing of the logic circuit, each inverting logic gate in the ring oscillator must be connected to similar gates equal in number to the proposed fan out loading. For large fan out testing of very fast gates, ring oscillator methods can require a very large test structure. A large test structure is undesirable because of statistical testing and yield considerations.

The delayed Johnson counter method relies on the fact that in operation of the digital logic circuit, the maximum frequency which can be introduced into the input of the counter and be observed to produce a toggling output is related to the average propagation delay of the device under test. Although the delayed Johnson counter may require fewer devices under test than does the ring oscillator method, high frequency test fixuring is still required. In addition, an external high frequency stimulus is also required.

A feature of the present invention is that lower frequency test fixuring may be utilized to determine the small propagation delay of the digital logic circuit. An advantage of the present invention is that the circuit for propagation delay measurement requires significantly fewer logic gates than the prior art ring oscillator method.

Another advantage of the present invention is that measurement to the output signal does not involve any harmonics of the output signal. Using the prior art ring oscillator method, for example, measurements of the output signal may actually be measurements of a harmonic of the output signal, thereby resulting in an erroneous analysis.

SUMMARY OF THE INVENTION

The present invention involves a circuit for measuring small propagation delays associated with a digital logic circuit. A first signal path in the digital logic circuit has at least a first predetermined number of devices and has an input and an output. Similarly, a second signal path in the digital logic circuit has at least a second predetermined number of devices and also has an input and an output. An input multiplexer multiplexes a predetermined input signal to the inputs of the first and second signal paths. First and second output signals are thereby produced on the outputs of the first and second signal paths, respectively. An output multiplexer multiplexes the output signals from the first and second signal path. The input and output multiplexers cause the input signal to alternately flow through the first and second signal paths. An average propagation delay is determined from the output signals in the multiplexed output signal.

The input signal in the preferred embodiment is a predetermined series of pulses or a square wave. Furthermore, the first predetermined number of devices in the first signal path is different than the second predetermined number of devices in the second signal path. The circuit may have a plurality of signal paths each having an input and output.

The average propagation delay of the digital logic circuit is obtained by first digitizing a waveform of each output signal in the multiplexed output signal. The differential area between the digitized waveforms is then calculated and the average propagation delay is determined from the differential area.

BRIEF DESCRIPTION OF THE DRAWINGS

The features of the present invention which are believed to be novel are set forth with particularity in the appended claims. The invention together with further objects and advantages thereof may best be understood by reference to the following description, taken in conjunction with the accompanying drawings in the several figures of which like reference numerals identify like elements, and in which:

DESCRIPTION OF THE PREFERRED EMBODIMENT

Figure 1:
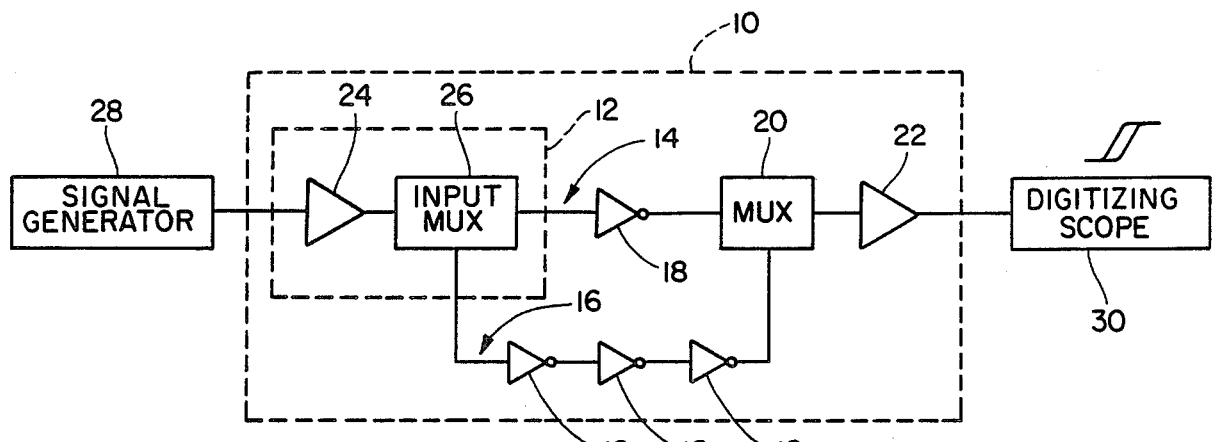
FIG. 1 is a diagram of the novel circuit for measuring small propagation delays.

In the preferred embodiment the present invention utilizes the test circuit shown in FIG. 1. This test circuit would typically be part of a large scale integrated chip with other digital logic circuitry. As shown in FIG. 1, the circuit on a large scale integrated chip 10 has an input means 12 for supplying a predetermined input signal to the inputs of a first signal path 14 and a second signal path 16. The first signal path 14 has a first predetermined number of devices 18 which is different than a second predetermined number of devices 18 in the second signal path 16. Output signals from the first signal path 14 and the second signal path 16 are combined by multiplexer 20 to produce a multiplexed output signal. A buffer 22 may be utilized to properly scale the voltage levels of the multiplexed output signal.

Figure 2:
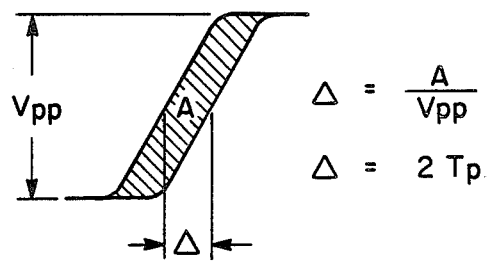
FIG. 2 is a graph of the outut waveforms from the digital logic devices under test in the FIG. 1 circuit.

The devices 18 can be inverting logic gates or noninverting logic gates. If the devices 18 are inverting logic gates, the difference in the number of devices 18 between the first and second signal paths 14, 16 must be an even number so that the proper comparison can be made of the waveforms of the output signals, as shown in FIG. 2. If the devices 18 are noninverting logic gates, the difference in the number of devices 18 between the first and second signal paths 14, 16 can be any integer number, because the signal is never inverted as it passes through the signal path 14 or 16. One type of a noninverting logic gate is a transmission gate.

The input means 12 may have an input buffer 24 to insure that the proper logic voltage levels are provided to the first and second signal paths 14 and 16. The input signal may be applied directly to the inputs of the first and second signal paths 14 and 16 or, as shown in FIG. 1, an input multiplexer 26 may be used to alternately supply the input signals.

In the preferred embodiment the input signal is supplied by generator 28 and may be a predetermined series of pulses or a predetermined square wave. An advantage of the present invention over the prior art is that the input signal may have a frequency of approximately 1 MHz. Typical prior art input frequencies for use with prior art ring oscillators or delayed Johnson counter circuits are approximately 400 MHz. Therefore, extreme bandwidth measurement instrumentation and test fixtures are not required for the present invention.

Figure 3:
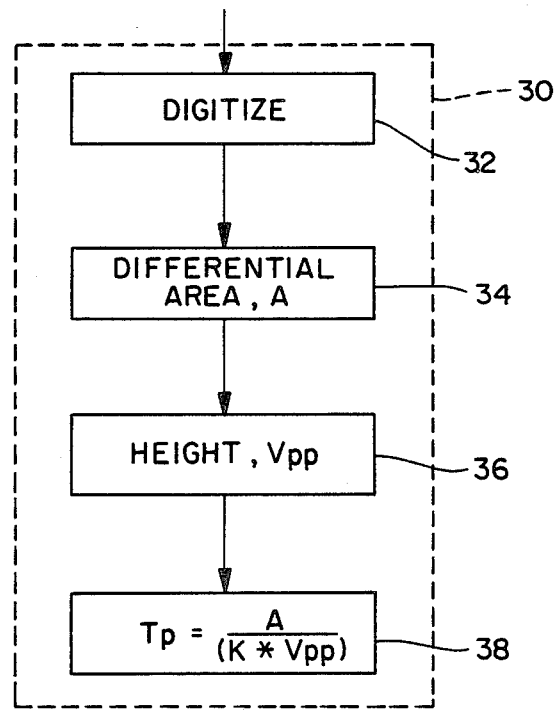
FIG. 3 is a block diagram illustrating how the small propagation delay is derived from the output waveforms of the digital logic circuit.

Instrument 30 compares the output signals in the multiplexed output signal to produce the average propagation delay of the devices 18 in the first and second signal paths 14 and 16. In the instrument 30 as shown in block diagram form in FIG. 3 the output signals are first digitized by digitizer 32. The differential area between the digitized waveforms is then calculated by apparatus 34. Apparatus 36 measures the height of the multiplexed output signal and apparatus 38 calculates the small propagation delay from this information by the following formula:

$$T_p = A/(k \times V_{pp}),$$

where k is the difference in the number of devices 18 in the first and second signal paths 14 and 16. It can be appreciated by one skilled in the art that there are numerous approaches to implementing the instrument 30. For example, each of the apparatus 32, 34, 36 and 38 may be a custom designed circuit. Alternatively, the instrument 30 could be a specially programmed general purpose computer. In the preferred embodiment, a Tektronics 7854 programmable digitizing scope was used as the instrument 30. The Tektronics scope was programmed to perform according to the diagram shown in FIG. 3.

FIG. 2 shows as a graph the differential area between two output signals in the multiplexed output signal. Use of this differential area in calculating the small propagation delay of the digital logic circuit is a unique feature of the present invention. As shown in FIG. 1 the devices 18 are typically inverting logic gates.

Figure 4:
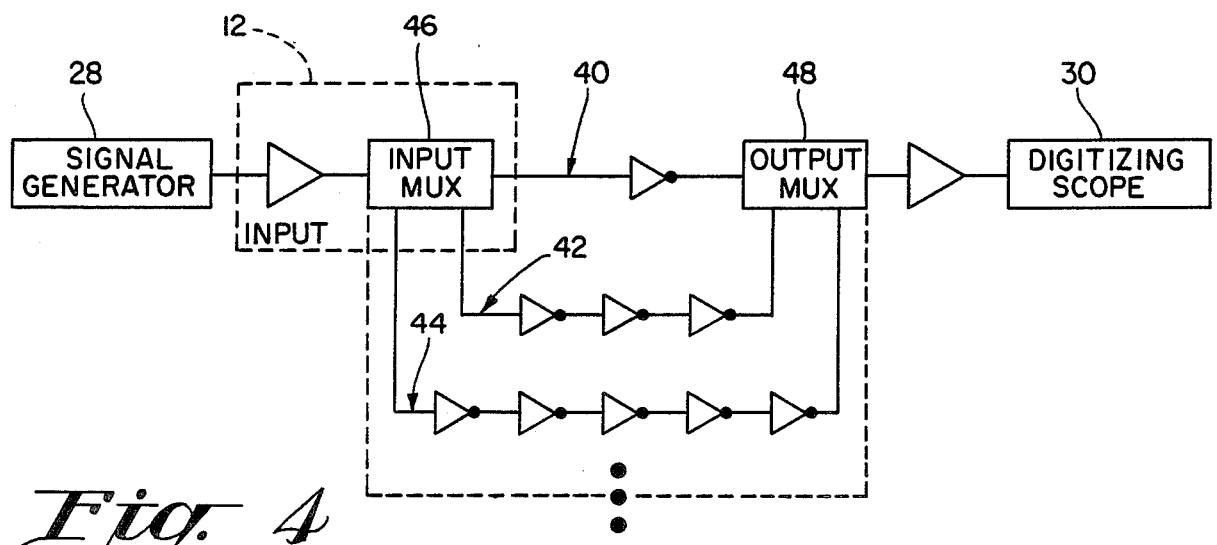
FIG. 4 is a schematic of a circuit for measuring small propagation delays in which there are a plurality of signal paths in the digital logic circuits.

As shown in FIG. 4 the circuit on the large scale integration chip may have a plurality of signal paths, 40, 42, 44. Appropriate input and output multiplexers 46 and 48 are connected to the inputs and outputs, respectively, of the signal paths to sequentially combine output signals into a multiplexed output signal. In calculating the small propagation delay by the instrument 30 at least one pair of output signals is selected from the multiplexed output signal. The small propagation delay measurement then corresponds to a pair of signal paths in the digital logic circuitry. Further calculations can then be made for other pairs of paths in the digital logic circuitry to yield further information.

Figure 5:
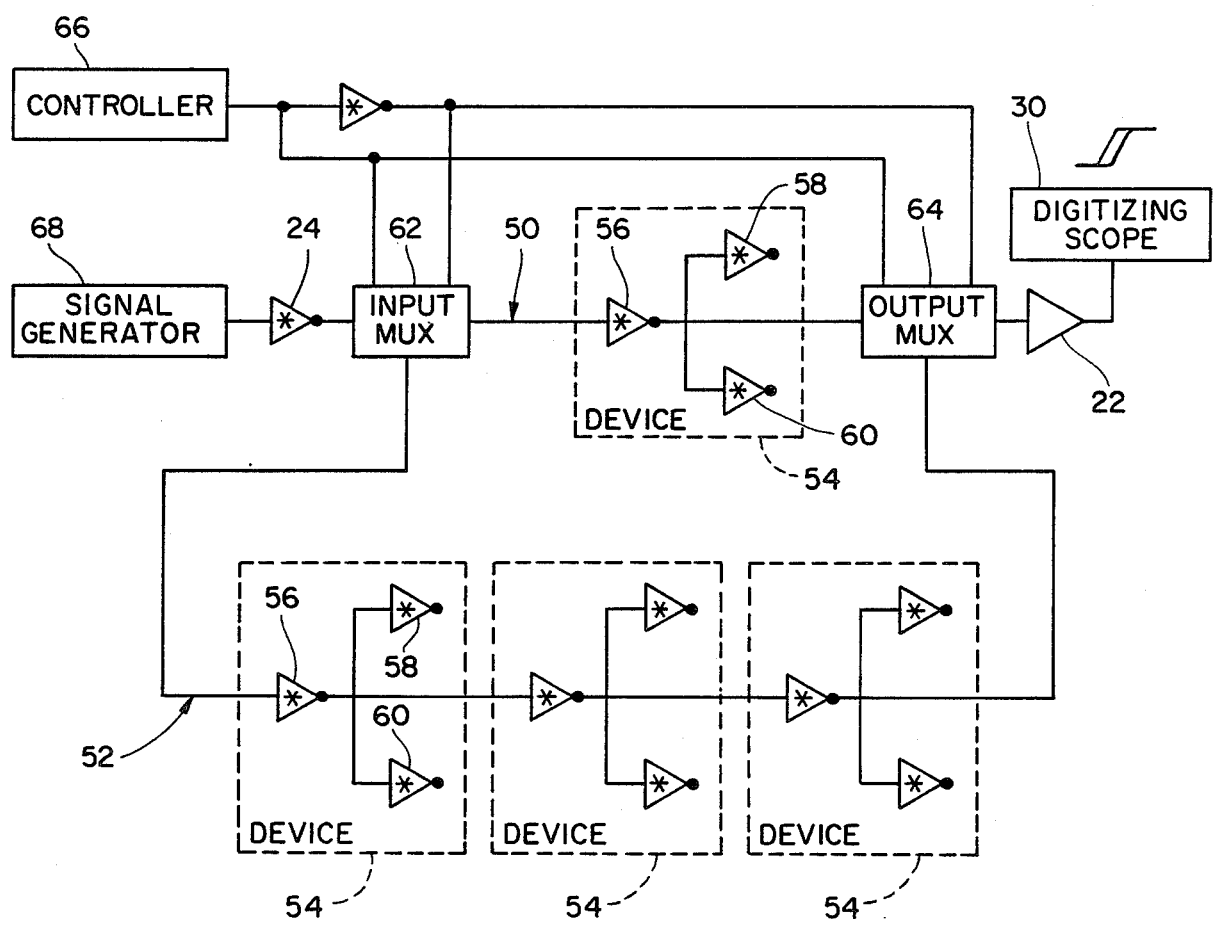
FIG. 5 is another schematic of a circuit for measuring small propagation delays in a digital logic circuit having a fanout of level 3.

In an alternative embodiment, as shown in FIG. 5, the propagation delay for a test circuit having a predetermined fanout may also be calculated. The FIG. 5 circuit shows each of the first and second signal paths 50 and 52 having a fanout of 3. In this embodiment each device 54 in the signal paths 50 and 52 is a first inverting logic gate 56 having an output and two inverting logic gates 58 and 60 each having an input operatively connected to the output of the first inverting logic gate 56, thereby forming a digital logic circuit having a fanout of 3. Also shown in FIG. 5 is the input circuitry for controlling the input and outut multiplexers 62 and 64. These multiplexers 62 and 64 are operated by controller 66 to alternately send the input signal from generator 68 through the first and second signal paths 50 and 52.

The invention is not limited to the particular details of the apparatus and method depicted and other modification and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A circuit for measuring small propagation delays associated with a digital logic circuit comprising:
    first signal path in the digital logic circuit having at least a first predetermined number of devices and having an input and an output;
    second signal path in the digital logic circuit having at least a second predetermined number of devices different from said first predetermined number of devices and having an input and an output;
    input means for supplying a predetermined input signal to said inputs of said first and second signal paths, thereby producing first and second output signals on said outputs of said first and second signal paths;
    output means operatively connected to said outputs of said first and second signal paths for multiplexing said first and second output signals to alternately combine said first and second output signals into a multiplexed output signal; and
    means for comparing said output signals in said multiplexed output signal operatively connected to an output of said output means for multiplexing to produce an average propagation delay of said devices in said first and second signal paths.

2. The circuit described in claim 1 wherein said input signal is a predetermined series of pulses.

3. The circuit described in claim 1 wherein said input signal is a predetermined square wave.

4. The circuit described in claim 1 wherein said circuit comprises a plurality of signal paths each having an input and an output and each input operatively connected to said input means for supplying and each output operatively connected to said output means for multiplexing.

5. The circuit described in claim 1 wherein said input means for supplying comprises:
    input means for buffering said input signal; and
    input multiplexer having an input operatively connected to an output of said input buffering means, said input multiplexer having outputs operatively connected to said inputs of said first and second signal paths.

6. The circuit described in claim 1 wherein said output means for multiplexing comprises;
output multiplexer having inputs operatively connected to said outputs of said first and second signal paths and having an output; and
output means for buffering having an input operatively connected to said output of said output multiplexer and having an output.

7. The circuit described in claim 1 wherein said output means for comparing comprises:
means for digitizing a waveform of each output signal in said multiplexed output signal, said means for digitizing operatively connected to said output means for multiplexing;
means for calculating the differential area between said digitized waveforms; and
means for determining said average propagation delay from said differential area.

8. The circuit described in claim 7 wherein said means for determining said average propagation delay comprises:
means for measuring the height of said multiplexed output signal; and
means for dividing said differential area by a number or numbers equal to the difference in the number of devices in said first and second signal paths times said height of said multiplexed output signal to produce said average propagation delay.

9. The circuit described in claim 1 wherein said device comprises an inverting logic gate and wherein the difference between the number of devices in said first signal path and said second signal path is an even number.

10. The circuit described in claim 1 wherein said device comprises:
first inverting logic gate having an output, and
N logic gates each having an input operatively connected to said output of said first inverting logic gate, thereby forming a digital logic circuit having a fanout of N.

11. The circuit described in claim 1 wherein said device comprises a noninverting logic gate and wherein the difference between the number of devices in said first signal path and said second signal path is an integer number.

12. A circuit for measuring small propagation delays associated with a digital logic circuit comprising:
plurality of signal paths in the digital logic circuit each having an input and an output, at least a first set of said signal paths having a first predetermined number of devices and at least a second set of said signal paths having a second predetermined number of devices different from said first predetermined number of devices;
input means for supplying a predetermined input signal to said inputs of said signal paths, thereby producing an output signal on each of said outputs of said signal paths;
output means for multiplexing said output signals operatively connected to said outputs of said plurality of signal paths to sequentially combine said output signals into a multiplexed output signal; and
means for comparing said output signals in said multiplexed output signal operatively connected to an output of said output means for multiplexing to produce an average propagation delay of said devices in said signal paths.

13. The circuit described in claim 12 wherein said input signal is a predetermined series of pulses.

14. The circuit described in claim 12 wherein said input signal is a predetermined square wave.

15. The circuit described in claim 12 wherein said input means for supplying comprises:
input means for buffering said input signal; and
input multiplexer having an input operatively connected to an output of said input buffering means, said input multiplexer having outputs operatively connected to said inputs of said signal paths.

16. The circuit described in claim 12 wherein said output means for multiplexing comprises:
output multiplexer having inputs operatively connected to said outputs of said signal paths and having an output; and
output means for buffering having an input operatively connected to said output of said output multiplexer and having an output.

17. The circuit described in claim 12 wherein said means for comparing comprises:
means for digitizing waveforms of at least one predetermined pair of output signals in said multiplexed output signal, said means for digitizing operatively connected to said output means for multiplexing;
means for calculating the differential area between said digitized waveforms of said predetermined pair of output signals; and
means for determining said average propagation delay from said differential area.

18. The circuit described in claim 17 wherein said means for determining said average propagation delay comprises:
means for measuring the height of said multiplexed output signal; and
means for dividing said differential area of said digitized waveforms of said predetermined pair of outputs signals by a number or numbers equal to the difference in the number of devices in the pair of signal paths corresponding to the pair of digitized waveforms times said height of said multiplexed output signal to produce said average propagation delay.

19. The circuit described in claim 12 wherein said device comprises an inverting logic gate and wherein the difference between the number of devices in said first signal path and said second signal path is an even number.

20. The circuit described in claim 12 wherein said device comprises:
first inverting logic gate having an output; and
N logic gates each having an input operatively connected to said output of said first inverting logic gate, thereby forming a digital logic circuit having a fanout of N.

21. The circuit described in claim 12 wherein said device comprises a noninverting logic gate and wherein the difference between the number of devices in said first signal path and said second signal path is an integer number.

22. A method for measuring small propagation delays associated with a digital logic circuit comprising the steps of:
providing a first signal path in the digital logic circuit having at least a first predetermined number of devices and having an input and an output;

providing a second signal path in the digital logic circuit having at least a second predetermined number of devices different from said first predetermined number of devices and having an input and an output;

supplying a predetermined input signal to said inputs of said first and second signal paths, thereby producing first and second output signals on said outputs of said first and second signal paths;

multiplexing said output signals to alternately combine said first and second output signals into a multiplexed output signal; and comparing said output signals in said multiplexed output signal to produce an average propagation delay of said devices in said first and second signal paths.

23. The method described in claim 22 wherein said input signal is a predetermined series of pulses.

24. The method described in claim 22 wherein said input signal is a predetermined square wave.

25. The method described in claim 22 wherein said supplying a predetermined input signal comprises the steps of:

buffering said input signal; and multiplexing said buffered input signal alternately to said inputs of said first and second signal paths.

26. The method described in claim 22 wherein said multiplexing of said output signals comprises the steps of:

multiplexing said outputs of said first and second signal paths to produce a multiplexed output signal; and buffering said multiplexed output signal.

27. The method described in claim 22 wherein said comparing said multiplexed output signal comprises the steps of:

digitizing a waveform of each output signal in said multiplexed output signal;

calculating the differential area between said digitized waveforms; and determining said average propagation delay from said differential area.

28. The method described in claim 27 wherein said step of determining the average propagation delay comprises:

measuring the height of the multiplexed output signal; and dividing said differential area by a number or numbers equal to the difference in the number of devices in said first and second signal paths times said height of said multiplexed output signal to produce said average propagation delay.

* * * * *